United States Patent
Kato et al.

(10) Patent No.: US 9,068,116 B2
(45) Date of Patent: Jun. 30, 2015

(54) LUMINESCENT MATERIAL

(75) Inventors: Masahiro Kato, Naka-gun (JP); Yumi Fukuda, Tokyo (JP); Naotoshi Matsuda, Chigasaki (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 614 days.

(21) Appl. No.: 13/407,115

(22) Filed: Feb. 28, 2012

(65) Prior Publication Data

US 2013/0050980 A1    Feb. 28, 2013

(30) Foreign Application Priority Data

Aug. 24, 2011   (JP) ................... 2011-182626

(51) Int. Cl.
F21V 9/06 (2006.01)
C09K 11/77 (2006.01)
H01L 33/50 (2010.01)

(52) U.S. Cl.
CPC ......... *C09K 11/7734* (2013.01); *C09K 11/7774* (2013.01); *H01L 33/502* (2013.01)

(58) Field of Classification Search
CPC ..... H01L 33/502; H01L 33/50; H01L 33/641; H01L 2933/0041; H01L 33/504; F21V 9/06
USPC ........................................................ 362/293
See application file for complete search history.

(56) References Cited

U.S. PATENT DOCUMENTS

| 2004/0009438 A1* | 1/2004 | Zou et al. ................ 430/350 |
| 2009/0236963 A1 | 9/2009 | Nagatomi et al. |
| 2009/0267485 A1* | 10/2009 | Nagatomi et al. ............ 313/503 |
| 2010/0025632 A1 | 2/2010 | Fukuda et al. |
| 2010/0102707 A1 | 4/2010 | Fukuda et al. |
| 2011/0204769 A1 | 8/2011 | Fukuda et al. |
| 2012/0037849 A1 | 2/2012 | Fukuda et al. |

FOREIGN PATENT DOCUMENTS

| CN | 101522859 A | 9/2009 |
| EP | 2 003 183 A1 | 12/2008 |
| JP | 2002-531955 | 9/2002 |

(Continued)

OTHER PUBLICATIONS

U.S. Appl. No. 13/239,578, filed Sep. 22, 2011, Kato, et al.

(Continued)

*Primary Examiner* — William Carter
(74) *Attorney, Agent, or Firm* — Oblon, McClelland, Maier & Neustadt, L.L.P.

(57) ABSTRACT

According to one embodiment, the luminescent material emits light with an emission peak within a wavelength range of 490 to 580 nm when excited with light having a wavelength range of 250 to 500 nm and includes a particle containing a $Sr_3Si_{13}Al_3O_2N_{21}$-based crystal activated by Eu. The particle includes an outer region which is within a depth of 5 nm from a surface of the particle and an inner region which is deeper than the outer region. The outer region and the inner region satisfy a ratio $O_{outer}/O_{inner}$ of 1.0 to 3.8. $O_{outer}$ is an average of oxygen concentration in the outer region and $O_{inner}$ is an average of oxygen concentration in the inner region.

20 Claims, 10 Drawing Sheets

(56) References Cited

FOREIGN PATENT DOCUMENTS

| JP | 2004-115633 | 4/2004 |
| JP | 2004-516688 | 6/2004 |
| JP | 2005-52016 | 7/2005 |
| JP | 2011-17007 A | 1/2011 |
| WO | WO 2011/024296 A1 | 3/2011 |

OTHER PUBLICATIONS

Theo Hahn, "International Tables for Crystallography, vol. A: Space-group symmetry", Springer, (2005), pp. 206-207.

Office Action issued on Apr. 21, 2014 in the corresponding Taiwanese Application No. 101106261 (with English Translation).
U.S. Appl. No. 13/837,836, filed Mar. 15, 2013, Fukuda, et al.
Extended European Search Report issued Jul. 5, 2012 in Patent Application No. 12156915.6.
Korean Office Action issued Aug. 8, 2013, in Korea Patent Application No. 10-2012-19592 (with English translation).
Office Action and Search Report issued on Jan. 10, 2014 in the corresponding Chinese Patent Application No. 201210047613.1 (with English Translation).

* cited by examiner

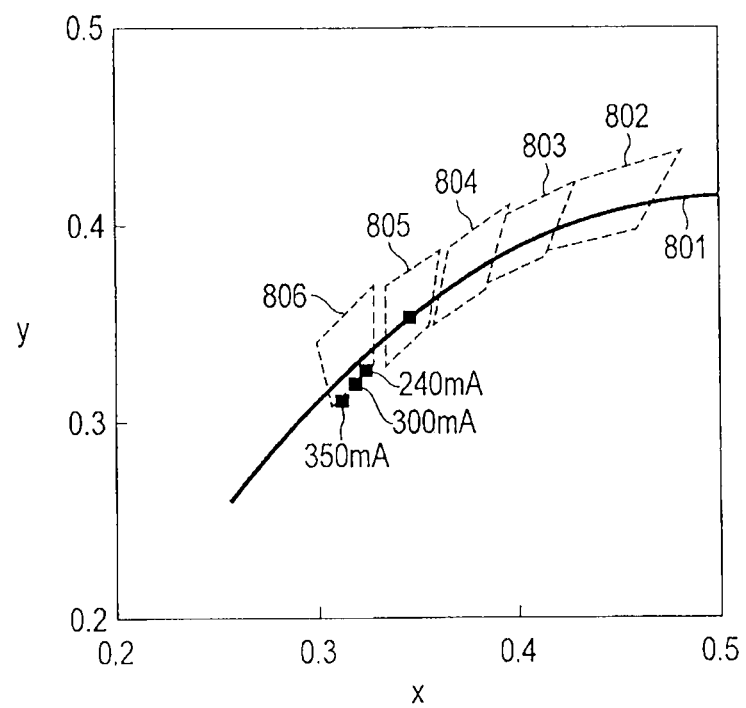
F I G. 10
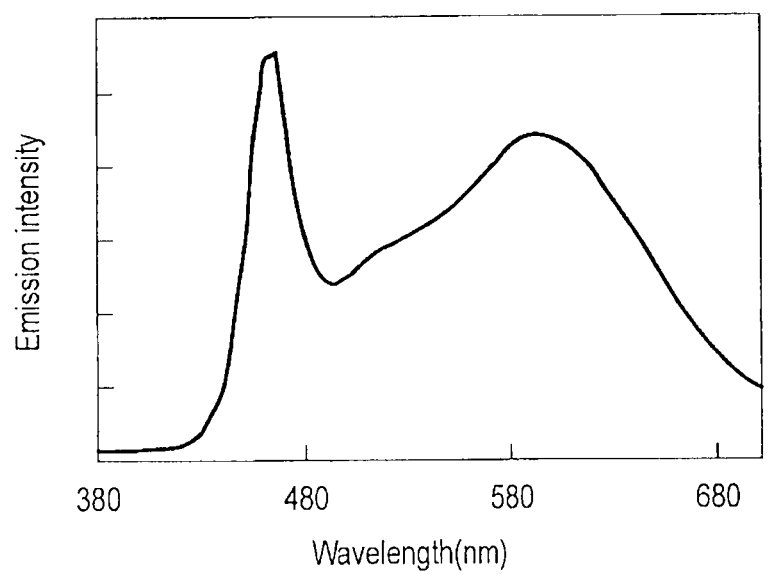
F I G. 11

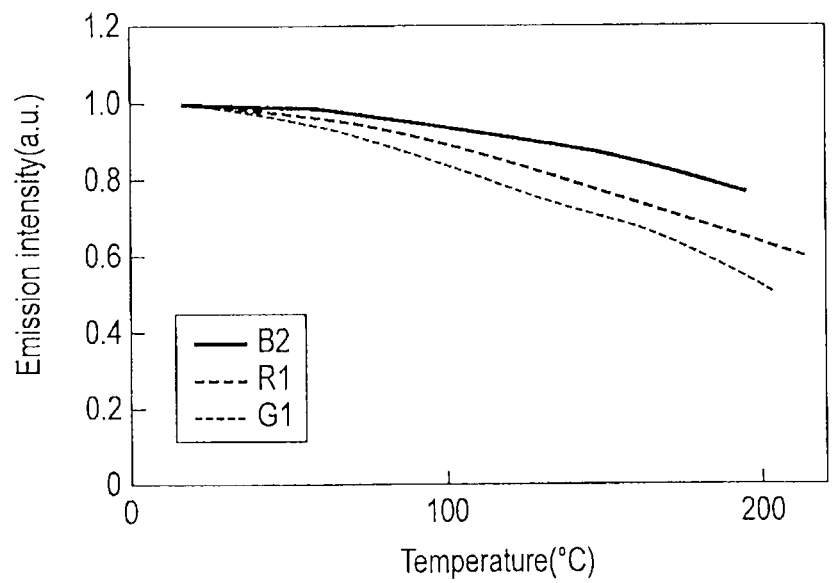
F I G. 12
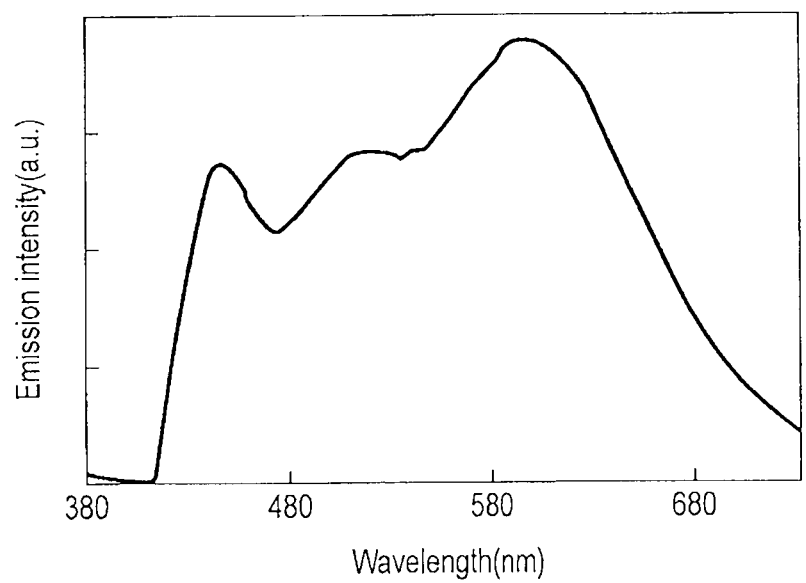
F I G. 13

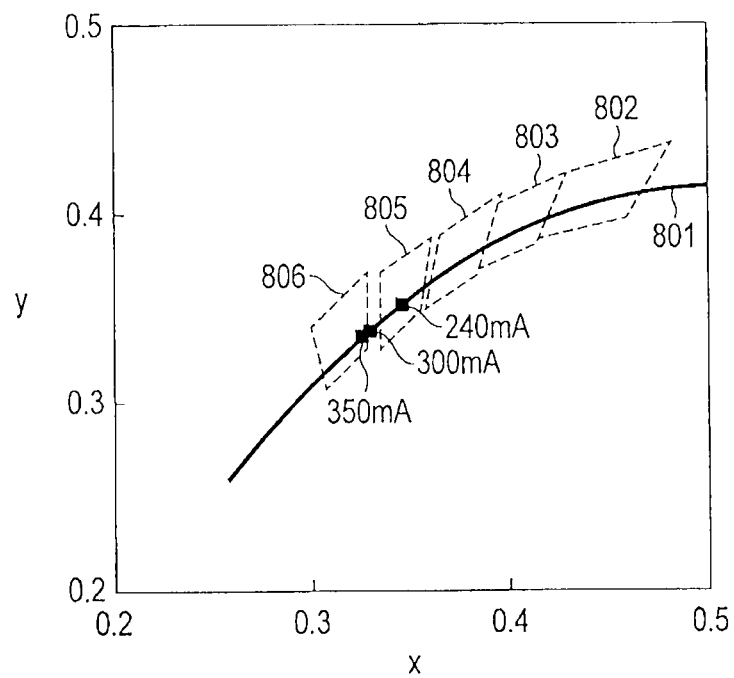
F I G. 14
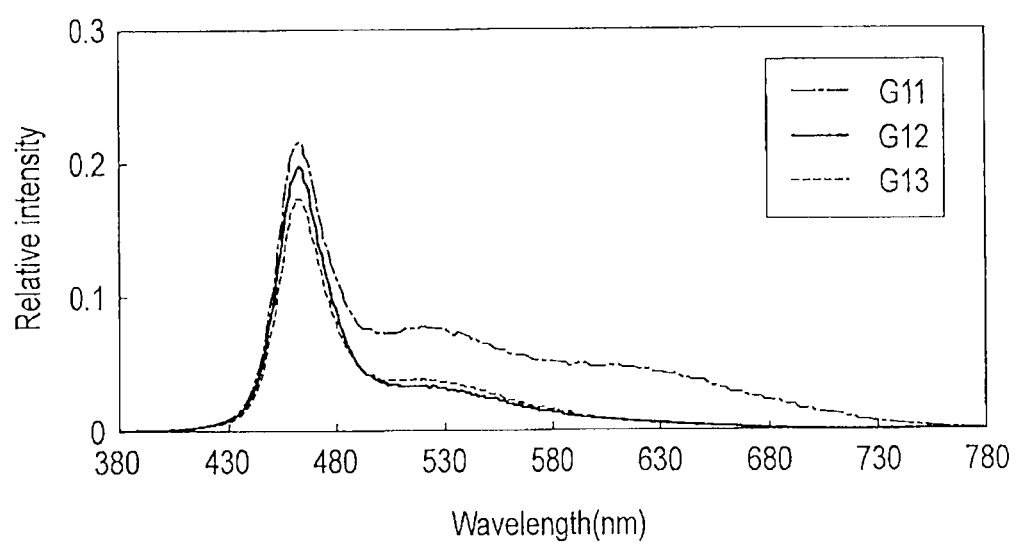
F I G. 15

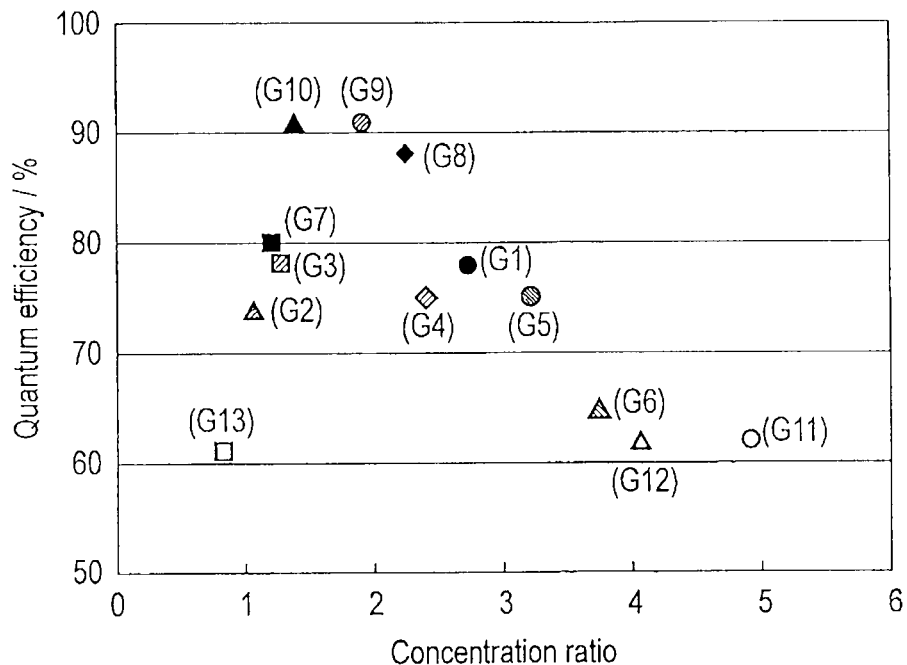
F I G. 16
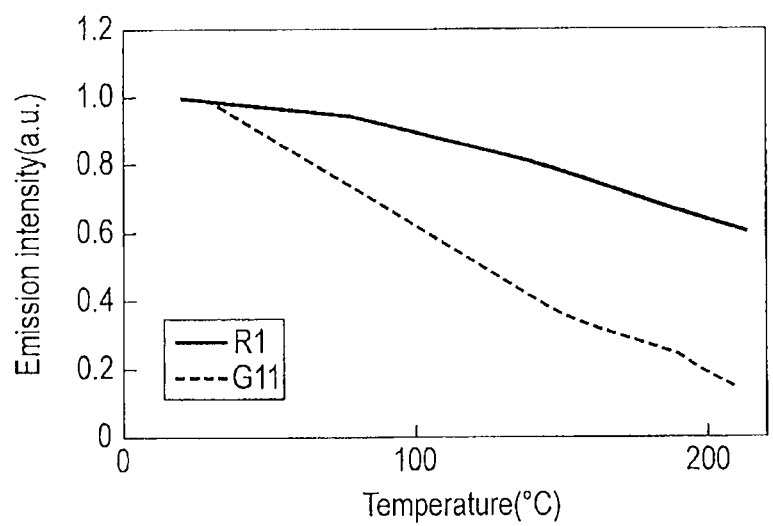
F I G. 17

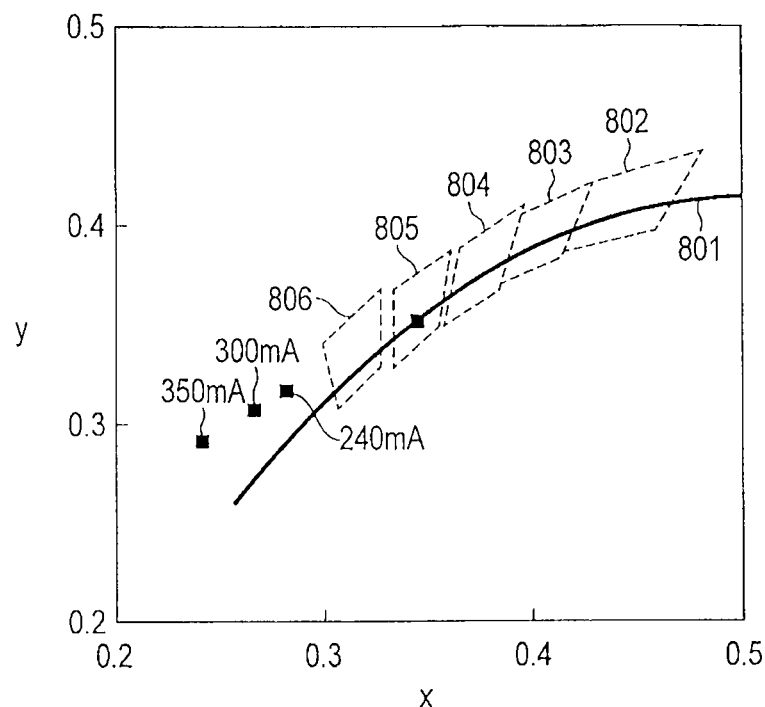
F I G. 18
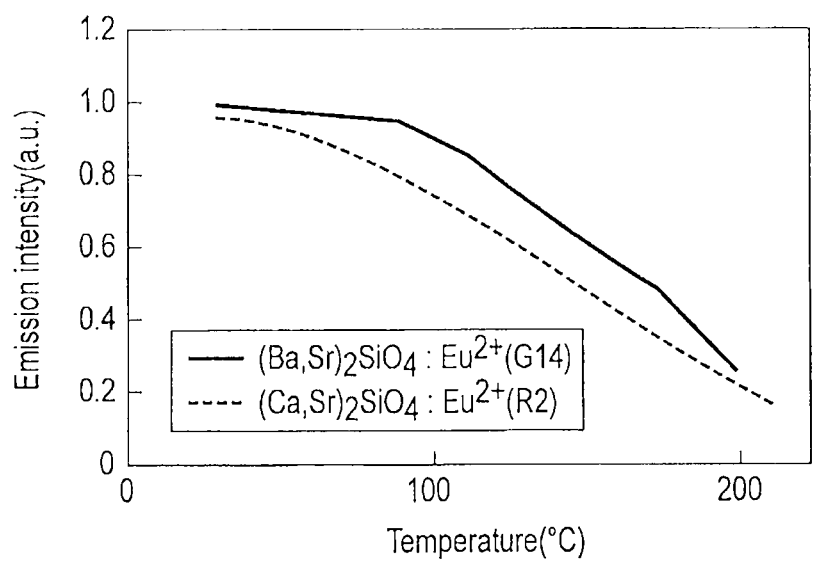
F I G. 19

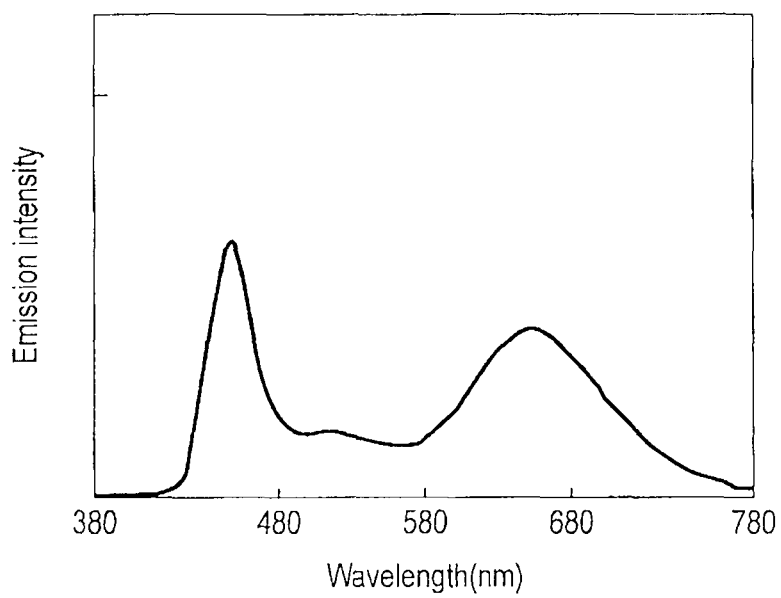
F I G. 20
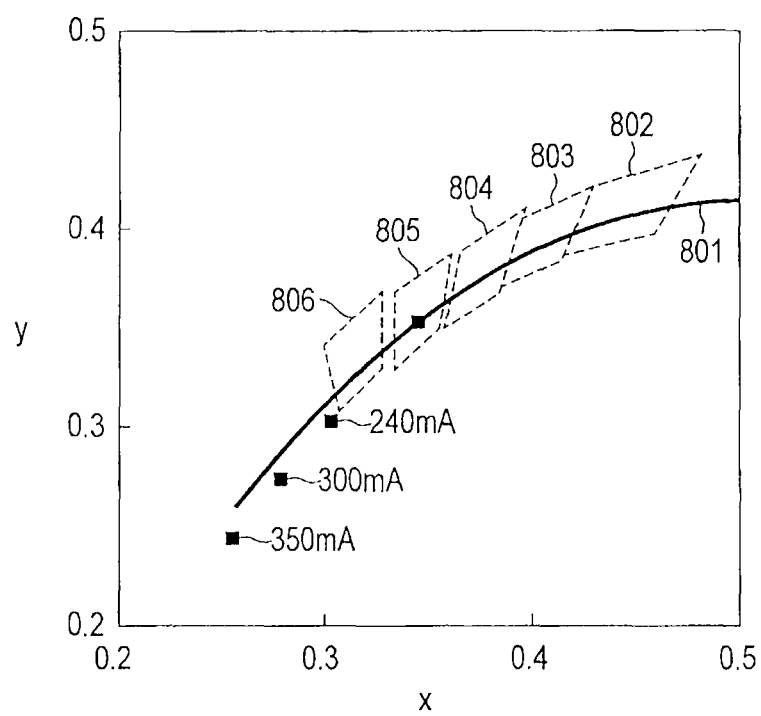
F I G. 21

LUMINESCENT MATERIAL

CROSS-REFERENCE TO RELATED APPLICATIONS

This application is based upon and claims the benefit of priority from prior Japanese Patent Application No. 2011-182626, filed Aug. 24, 2011, the entire contents of which are incorporated herein by reference.

FIELD

Embodiments described herein relate generally to a luminescent material, a light-emitting device, and a method of producing a luminescent material.

BACKGROUND

As a luminescent material (green emitting luminescent material) which exhibits green emission by excitation with blue light, an Eu-activated alkaline earth orthosilicate luminescent material has recently been suggested. A white light-emitting device is configured using the green emitting luminescent material in combination with a luminescent material which exhibits red emission by excitation with blue light (red emitting luminescent material) and a blue LED. In the green emitting luminescent material, a decrease in emission intensity is often caused by an increase in temperature of the blue LED. Since a decrease in emission intensity of the red emitting luminescent material is small, a balance between an emission by the blue LED and an emission by the luminescent material is easily lost.

A thermal quenching behavior of the green emitting luminescent material is different from that of the red emitting luminescent material and thus a balance of green and red is easily lost by an increase in temperature of the blue LED. Consequently, a balance between green light and red light from the luminescent materials and blue light from a light source is lost, which leads to a significant "color shift". Therefore, there is a need for a green emitting luminescent material which exhibits a small decrease in emission intensity (thermal quenching) even if the temperature is increased.

BRIEF DESCRIPTION OF THE DRAWINGS

FIG. 10 is a graph diagram showing the chromaticity (2 degree field of view) of the light-emitting device of Examples;

FIG. 11 is an emission spectrum of the light-emitting device of Examples;

FIG. 12 is a graph showing temperature characteristics of the luminescent material of Examples;

FIG. 13 is an emission spectrum of the light-emitting device of Examples;

FIG. 14 is a graph diagram showing the chromaticity (2 degree field of view) of the light-emitting device of Examples;

FIG. 15 is an emission spectrum of a green-emitting luminescent material of Comparative examples;

FIG. 16 shows a relationship between an oxygen concentration ratio ($O_{outer}/O_{inner}$) in the green emitting luminescent material and quantum efficiency;

FIG. 17 is a graph showing temperature characteristics of the luminescent material of Comparative examples;

FIG. 18 is a graph diagram showing the chromaticity (2 degree field of view) of the light-emitting device of Comparative examples;

FIG. 19 is a graph showing temperature characteristics of the luminescent material of Comparative examples;

FIG. 20 is an emission spectrum of the light-emitting device of Comparative examples; and FIG. 21 is a graph diagram showing the chromaticity (2 degree field of view) of the light-emitting device of Comparative examples.

DETAILED DESCRIPTION

Figure 1:
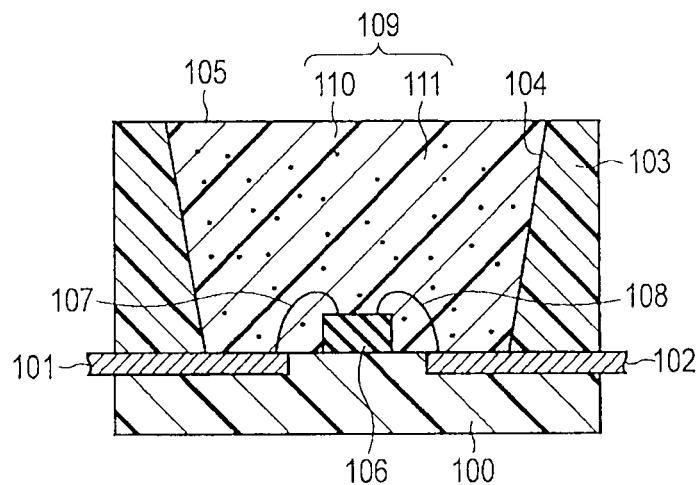
FIG. 1 is an outline cross-sectional view showing a configuration of a light-emitting device according to an embodiment.

In general, according to one embodiment, a luminescent material emits light with an emission peak within a wavelength range of 490 to 580 nm when excited with light having a wavelength range of 250 to 500 nm and comprises a particle containing a $Sr_3Si_{13}Al_3O_2N_{21}$-based crystal activated by Eu. The particle includes an outer region which is within a depth of 5 nm from a surface of the particle and an inner region which is deeper than the outer region. The outer region and the inner region satisfy a ratio $O_{outer}/O_{inner}$ of 1.0 to 3.8. $O_{outer}$ is an average of oxygen concentration in the outer region and $O_{inner}$ is an average of oxygen concentration in the inner region.

Hereinafter, embodiments will be specifically described.

A luminescent material according to an embodiment is in a form of particles each comprises an Eu-activated $Sr_3Si_{13}Al_3O_2N_{21}$-based crystal. When the luminescent material is excited with light having a wavelength of 250 to 500 nm, it exhibits an emission having a peak between the wavelengths of 490 nm and 580 nm. Since the luminescent material according to this embodiment has an emission peak between the wavelengths of 490 nm and 580 nm, it is the green emitting luminescent material.

The $Sr_3Si_{12}Al_3O_2N_{21}$-based crystal refers to an inorganic compound having a crystal structure substantially the same as that of $Sr_3Al_3Si_{13}O_2N_{21}$. The crystal of $Sr_3Al_3Si_{13}O_2N_{21}$ is a rhombic system and the lattice constant is a=14.76 Å, b=7.46 Å, and c=9.03 Å. That is, the luminescent material according to this embodiment is an inorganic compound containing oxynitride as a matrix component and the oxynitride has high covalent character.

The $Sr_3Si_{13}Al_3O_2N_{21}$-based crystal can be identified by X-ray diffraction. When diffraction peak positions of an XRD profile obtained by measuring a target luminescent material correspond to main peak positions of an XRD profile obtained by measuring $Sr_3Al_3Si_{13}O_2N_{21}$, the target luminescent material is defined as having substantially the same crystal structure as that of $Sr_3Al_3Si_{13}O_2N_{21}$.

Specifically, when a luminescent material exhibits ten or more peaks at the following 18 positions within 2θ=20° to 70° in its X-ray diffraction pattern, the luminescent material is defined as having the same crystal as that of $Sr_3Al_3Si_{13}O_2N_{21}$:

20.5°, 21.6°, 23.8°, 25.8°, 29.4°, 31.0° 31.7°, 32.0°, 34.2°, 34.9°, 36.1°, 36.4° 37.5°, 38.4°, 39.9°, 61.5°, 62.3°, 63.0°

Note that each of these positions may include a tolerance of ±0.1°.

Therefore, the $Sr_3Si_{13}Al_3O_2N_{21}$-based crystal is not limited to only a substance showing the same profile as the XRD profile of $Sr_3Al_3Si_{13}O_2N_{21}$. A substance in which the constant lattice is changed within a constant range by replacing the constituent element with other elements is also included in the $Sr_3Si_{13}Al_3O_2N_{21}$-based crystal in this embodiment.

Replacement of the constituent element with other elements means that, for example, a part of at least one element of Si, Al, O, and N is substituted in the following manner. Specific examples thereof include a crystal obtained by substituting a position of an element Si in the crystal of $Sr_3Al_3Si_{13}O_2N_{21}$ by at least one of tetravalent elements, a crystal obtained by substituting a position of Al by at least one of trivalent elements, and a crystal obtained by substituting a position of N by at least one of elements selected from the group consisting of O and C. The tetravalent element is selected from the group consisting of, for example, Ge, Sn, Ti, Zr, and Hf. The trivalent element is selected from the group consisting of, for example, B, Ga, In, Sc, Y, La, Gd, and Lu.

A part of an element O in the crystal of $Sr_3Al_3Si_{13}O_2N_{21}$ may be substituted by at least one element selected from the group consisting of N and C. However, the amount of substitution of the O by N and/or C is desired to be less than 99 mol %.

A structure in which a part of Al is replaced with Si and a structure in which a part of Si is replaced with Al are also included in the $Sr_3Al_3Si_{13}O_2N_{21}$-based crystal. Examples thereof include $Sr_3Al_2Si_{14}ON_{22}$, $Sr_3AlSi_{15}N_{23}$, $Sr_3Al_4Si_{12}O_3N_{20}$, $Sr_3Al_5Si_{11}O_4N_{19}$, and $Sr_3Al_6Si_{10}O_5N_{18}$.

The composition of the green emitting luminescent material according to an embodiment can be represented by, for example, the following composition formula (1).

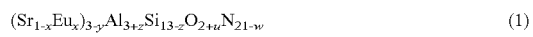
$(Sr_{1-x}Eu_x)_{3-y}Al_{3+z}Si_{13-z}O_{2+u}N_{21-w}$ (1)

(wherein 0<x<1, −0.1≤y≤0.30, −3≤z≤1, −3<u−w≤1.5)

When the composition of each element is specified within the above range, higher quantum efficiency is obtained. In a light-emitting device in which such a luminescent material is included in a fluorescent layer, the thermal quenching is suppressed and preferable temperature characteristics are achieved.

As shown in the composition formula (1) above, the luminescence center element Eu substitutes a part of Sr. If at least 0.1 mol % of Sr is substituted by Eu, a sufficient luminous effect can be obtained. When the amount of substitution by Eu is less than 50 mol %, the effect for suppressing a decrease in luminescence probability (concentration quenching) is further improved.

The luminescent material according to an embodiment is basically composed of Sr, Eu, Al, Si, O, and N. However, a small amount of impurities may be contained within a range that does not impair a desired effect. These impurities are, for example, included in a raw material or mixed in a manufacturing process. Specific examples thereof include Na, Ba, Ca, Mg, Cu, Fe, Pb, Cl, C, and B. The content of the elements of the impurities in the luminescent material is usually 0.2% by mass or less, preferably 300 ppm or less.

The luminescent material according to an embodiment contains a particle containing the crystal having the above composition. Oxygen in the crystal of $Sr_3Al_3Si_{13}O_2N_{21}$ is not uniformly present in the particle. Oxygen in the crystal is deflected to relatively near the surface of the particle. Specifically, a ratio $(O_{outer}/O_{inner})$ of an average $(O_{outer})$ of oxygen concentrations in an outer region within a depth of 5 nm from the surface of the particle to an average $(O_{inner})$ of oxygen concentrations in an inner region of a depth deeper than 5 nm from the surface of the particle is from 1.0 to 3.8.

In conventionally known similar luminescent materials, the full width half maximum (FWHM) when the diffraction peak position of 2θ in an X-ray diffraction pattern is from 15.2 to 15.5° is 0.16° or more. No luminescent material having a narrow half width like the luminescent material according to this embodiment has been known. This means that the crystalline quality of the luminescent material according to this embodiment is high. The luminescent material according to this embodiment generally has a plate-like crystal form. The term "plate-like" refers to a state that two surfaces which are two-dimensionally extended are opposed to each other and a distance between the two surfaces is about 30% or less of one side of the two surfaces. The crystal form of the luminescent material can be confirmed with, for example, a fluorescence microscope and a scanning secondary electron microscope.

The oxygen concentration in the luminescent material particle of this embodiment is determined by X-ray photoelectron spectroscopy (XPS). Specifically, the measurement can be performed using Quantera SXM (manufactured by PHI) under the following conditions:

X-ray source/output power/analytical region: single crystal AlKα/4.5 W/φ20 μm
Pass Energy: Narrow Scan-280.0 eV (0.25 eV/Step)
Geometry: θ=45° (θ: angle of the surface of a sample with respect to a detector)
Ar⁺ etching condition:
　Accelerating voltage 2 kV
　Raster size 2×2 mm
　Interval 0.25 min/step (about 1.7 nm/step)
　Rate of about 6.9 nm/min (in the case of T-SiO₂)
A ratio of the atomic number in a position toward the depth direction from the surface is obtained by the measurement. Based on the measurement results, an average $(O_{outer})$ of oxygen concentrations in an outer region within a depth of 5 nm from the surface of the luminescent material particle can be determined by calculating an average of atomic ratios in each position within a depth of 5 nm from the surface. An average of atomic ratios in a position with a depth of 5 to 150 nm from the surface is calculated to obtain an average $(O_{inner})$ of oxygen concentrations in an inner region with a depth deeper than 5 nm from the surface of the particle.

In the luminescent material particle of this embodiment, a ratio $(O_{outer}/O_{inner})$ of an average $(O_{outer})$ of oxygen concentrations in the crystal in an outer region within a depth of 5 nm from the surface to an average $(O_{inner})$ of oxygen concentrations in the crystal in an inner region with a depth deeper than 5 nm from the surface is from 1.0 to 3.8. That is, in the luminescent material particle of this embodiment, oxygen in the $Sr_3Si_{13}Al_3O_2N_{21}$-based crystal is not uniformly present and the oxygen concentration in an outer region of the particle is higher than that in an inner region of the particle.

The present inventors have obtained the following findings about the oxygen concentration in the luminescent material particle. When the oxygen concentration in the inner region of the luminescent material particle is about equal to that of the outer region, the quantum efficiency is decreased. The particle diameter of the luminescent material particle is usually from about 20 to 100 μm. When the cross section of the luminescent material particle is observed under a microscope, a difference in contrast between the surface portion and inner portion can be seen. Consequently, the present inventors have paid attention to the outer region within a depth of 5 nm from the surface and the inner region with a depth deeper than 5 nm from the surface.

The average ($O_{outer}$) of oxygen concentrations in an outer region within a depth 5 nm from the surface in the luminescent material particle is higher than the average ($O_{inner}$) of oxygen concentrations in an inner region with a depth deeper than 5 nm from the surface in the luminescent material particle, which causes a difference in a refractive index. As a result, the light extraction efficiency is improved. However, if the average ($O_{outer}$) of the oxygen concentrations in an outer region of the particle becomes excessively large, this is beyond the composition of the crystal of $Sr_3Al_3Si_{13}O_2N_{21}$ described above.

In order to obtain a high quantum efficiency while maintaining a predetermined crystal composition, in this embodiment, a ratio ($O_{outer}/O_{inner}$) of an average ($O_{outer}$) of oxygen concentrations in an outer region within a depth of 5 nm from the surface of the particle to an average ($O_{inner}$) of oxygen concentrations in an inner region with a depth deeper than 5 nm from the surface is specified to a range of 1.0 to 3.8. This range allows a quantum efficiency of 65% or more to be ensured. When the oxygen concentration ratio ($O_{outer}/O_{inner}$) is within a range of 1.0 to 3.2, a high quantum efficiency of 70% or more is obtained.

Due to high quantum efficiency, the green emitting luminescent material of this embodiment has a small decrease in emission intensity even if the temperature is increased. The reason for this will be described as below. As a cause of a decrease in the emission intensity due to temperature, defects in the crystal are cited. This is because if defects in the crystal are small, the quantum efficiency becomes high.

The green emitting luminescent material of this embodiment can be produced by mixing raw material powder containing each element and burning.

An Sr raw material can be selected from, for example, nitrides, oxides, and hydroxides of Sr. An Al raw material can be selected from, for example, nitrides, oxides, and carbides of Al. The Si raw material can be selected from, for example, nitrides, oxides, and carbides of Si. Usable examples of a raw material of the luminescence center element Eu include oxides, nitrides or carbonates of Eu.

Nitrogen can be provided from nitride raw materials and oxygen can be provided from surface oxidized films of oxide raw materials and oxide raw materials.

For example, $Sr_3N_2$, AlN, $Si_3N_4$, $Al_2O_3$, and EuN are mixed in the batch composition so as to be a target composition. In place of $Sr_3N_2$, $Ca_3N_2$, $Ba_3N_2$, $Sr_2N$, or SrN or mixtures thereof may be used. In order to obtain a uniform mixed powder, it is desirable to perform dry-blending in the order of material powder with a mixing mass from low to high.

The raw materials can be mixed in, for example, a mortar in a glove box. The luminescent material according to this embodiment is obtained by placing the mixed powder in a crucible and burning under a predetermined condition. The material of the crucible is not particularly limited and it can be selected from boron nitride, silicon nitride, silicon carbide, carbon, aluminum nitride, sialon, aluminum oxide, molybdenum, tungsten and the like.

The mixed powder is first heat-treated in a nitrogen atmosphere. The heat treatment time in the nitrogen atmosphere is generally 2 hours or more and a longer time is preferable. The heat treatment time is preferably 4 hours or more, more preferably 6 hours or more, most preferably 8 hours or more. If the heat treatment time is too short, the crystal growth becomes insufficient and the quantum efficiency may be decreased.

It is desirable that the heat treatment in the nitrogen atmosphere is performed at a pressure more than an atmospheric pressure. If the heat treatment is performed at a pressure more than an atmospheric pressure, this is advantageous from the viewpoint of difficulty in decomposition of silicon nitride. In order to suppress the decomposition of silicon nitride at high temperatures, a pressure of 5 atmospheres or more is more preferable and the heat treatment temperature is preferably from 1500 to 2000° C. If the temperature range is within the above level, a target sintered body is obtained without causing an inconvenience such as sublimation of materials or products. The heat treatment temperature is more preferably from 1700 to 1950° C.

When the heat treatment is carried out in the nitrogen atmosphere, burning is performed while avoiding the oxidation of AlN. Then, a luminescent material in which the distribution of oxygen concentration is controlled is obtained.

The powder after heat treatment in a nitrogen atmosphere is crushed and mixed, followed by mixing and then subjecting to heat treatment in a vacuum atmosphere. Here, the term "vacuum" refers to a degree of vacuum of 13.3 Pa or less. The temperature of heat treatment in the vacuum atmosphere is from 400 to 600° C. In the case of less than 400° C., a luminescent material with target characteristics is not obtained. On the other hand, in the case of more than 600° C., there is a possibility that oxidation of the surface may significantly proceed. The heat treatment temperature in the vacuum atmosphere is preferably from 450 to 550° C.

The heat treatment time in the vacuum atmosphere is preferably from about 0.1 to 12 hours. If the heat treatment is performed for the above time period, a desired effect can be obtained. The heat treatment time is, more preferably, from about 1.0 to 6 hours.

The aim of this is to remove as much adsorbed moisture as possible before subsequent heat treatment at high temperatures. Accordingly, the vacuum atmosphere herein is desirably 13.3 Pa or less. It is assumed that when the heat treatment is performed at 400 to 600° C. in the vacuum atmosphere, oxygen in the luminescent material is deflected to near the surface.

After the heat treatment in the vacuum atmosphere, the atmosphere is changed to a reducing atmosphere of $N_2/H_2$ and the heat treatment is performed. It is an object that oxygen in the crystal is reduced to nitrogen. Thus, the hydrogen concentration in the reducing atmosphere of $N_2/H_2$ is specified as 1% or more and less than 100%.

The heat treatment temperature in the reducing atmosphere is preferably from 1300 to 1700° C. If the temperature range is within the above level, a target luminescent material is obtained without causing an inconvenience such as sublimation of materials or products. The heat treatment temperature is, more preferably, from 1400 to 1600° C. The heat treatment time in the reducing atmosphere is preferably from about 0.5 to 24 hours. If the heat treatment is performed for the duration of the above time, a desired effect can be obtained. The heat treatment time is preferably from about 1.0 to 12 hours.

After heat treatment in the reducing atmosphere, post-treatment such as washing is performed if necessary and the luminescent material according to an embodiment is obtained. The washing can be performed using, for example, pure water or acid. Usable examples of the acid include inorganic acids such as sulfuric acid, nitric acid, hydrochloric acid, and hydrofluoric acid; organic acids such as formic acid, acetic acid, and oxalic acid; and mixed acids thereof.

A light-emitting device according to an embodiment includes a fluorescent layer containing the luminescent material and a light-emitting element which excites the luminescent material. FIG. 1 is an outline cross-sectional view showing a configuration of a light-emitting device according to an embodiment.

In the light-emitting device shown in FIG. 1, leads 101 and 102, and a package cup 103 are arranged on a substrate 100. The substrate 100 and the package cup 103 are made of resins. The package cup 103 has a concave 105 in which an upper portion is wider than a bottom portion and the side surface of the concave acts as a reflective surface 104.

A light-emitting element 106 is mounted on a nearly circular center of the bottom surface of the concave 105 by Ag paste or the like. Usable examples of a light-emitting element 106 include light emitting diodes and laser diodes. For example, any diode that emits ultraviolet rays can be used and is not particularly limited thereto. A light-emitting element which emits light other than ultraviolet rays, such as blue, purple-blue or near-ultraviolet light may be used. Specific examples thereof include semiconductor light emitting elements such as GaN.

Electrodes (not shown) of the light-emitting element 106 are connected to leads 101 and 102 by bonding wires 107 and 108 composed of Au and the like. The arrangement of the leads 101 and 102 can be appropriately changed.

A fluorescent layer 109 containing a luminescent material 110 according to an embodiment is disposed in the concave 105 of the package cup 103. In the fluorescent layer 109, 5 to 50% by mass of the luminescent material is contained, for example, in a resin layer 111 composed of silicone resin and the like. As described above, in the luminescent material according to this embodiment, oxynitride with high covalent character is used as a matrix component. Thus, the luminescent Material according to this embodiment is hydrophobic and has very good compatibility with the resin. Therefore, the scattering at the interface between the resin layer and the luminescent material is significantly suppressed and thus the light extraction efficiency is improved.

As the light-emitting element 106, a flip chip type light-emitting element having an n electrode and a p electrode on the same surface can be used. In this case, problems caused by wires such as the disconnection and peeling of wires and light absorption by the wires are solved and a highly reliable semiconductor light-emitting device with high intensity is obtained. A configuration below can be formed using a light-emitting element having an n type substrate. The n electrode is formed on the back of the n type substrate of the light-emitting element and the p electrode is formed on the upper surface of the p type semiconductor layer stacked on the substrate. The n electrode is mounted on a lead and the p electrode is connected to the other lead by a wire.

The luminescent material according to this embodiment is the green emitting luminescent material in which a decrease in the emission intensity is small even if the temperature is increased. Therefore, the light-emitting device shown in FIG. 1 can emit green light with high intensity even if the temperature is increased.

The size of the light-emitting element 106 as well as the size and shape of the concave portion 105 can be appropriately changed.

The light-emitting device according to an embodiment is not limited to the package cup type shown in FIG. 1 and it can be appropriately changed. Specifically, in the case of a bomb-shell type LED or a surface mounting type LED, similar effects can be obtained by applying the luminescent material of the embodiment.

Figure 2:
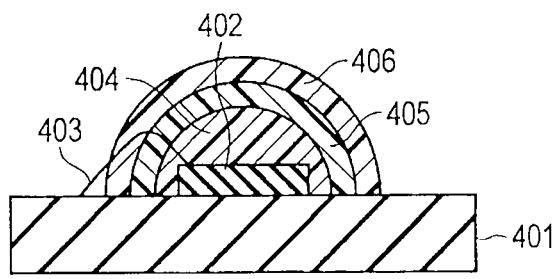
FIG. 2 is an outline cross-sectional view showing a configuration of a light-emitting device according to another embodiment.

FIG. 2 is an outline cross-sectional view showing a configuration of a light-emitting device according to another embodiment. In the light-emitting device illustrated, electrodes (not shown) are formed in a predetermined region of an insulation substrate 401 with heat dissipation property and a light-emitting element 402 is arranged thereon. The material of the insulation substrate with heat dissipation property can be, for example, AlN. One of the electrodes in the light-emitting element 402 is formed on the bottom surface and is electrically connected to the electrode of the insulation substrate 401 with heat dissipation property. The other electrode in the light-emitting element 402 is connected to an electrode (not shown) on the insulation substrate 401 with heat dissipation property via a gold wire 403. As the light-emitting element 402, for example, a light emitting diode which emits light with a wavelength of 250 to 500 nm can be used.

A transparent resin layer 404 with a dome shape, a first fluorescent layer 405, and a second fluorescent layer 406 are sequentially formed on the light-emitting element 402. The transparent resin layer 404 can be formed using, for example, silicone. The first fluorescent layer 405 may be, for example, a resin layer in which the red emitting luminescent material is dispersed. The second fluorescent layer 406 may be a resin layer in which the green emitting luminescent material of this embodiment is dispersed. In the light-emitting device illustrated, the first fluorescent layer 405 as a red-emitting layer and the second fluorescent layer 406 as a green-emitting layer are sequentially stacked on the transparent resin layer 404.

In the light-emitting device shown in FIG. 2, the green emitting luminescent material according to this embodiment is used in combination with a light-emitting element which emits blue light and a red emitting luminescent material. That is, the light-emitting device illustrated is a white light-emitting device. As already described, a decrease in the emission intensity of the green emitting luminescent material according to this embodiment is small even if the temperature is increased. Poor balance between green color and red color is suppressed even if the temperature is increased. Thus, a white light emitting device with a small "color shift" can be obtained.

Figure 3:
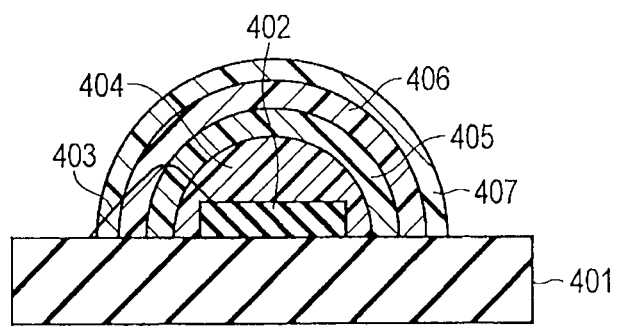
FIG. 3 is an outline cross-sectional view showing a configuration of a light-emitting device according to another embodiment.

When a light emitting diode which emits light having a wavelength of 250 to 430 nm is used as the light-emitting element 402, the third fluorescent layer 407 may be formed on the second fluorescent layer 406 as shown in FIG. 3. The third fluorescent layer 407 may be, for example, a resin layer in which the blue emitting luminescent material is dispersed. In the light-emitting device illustrated, the first fluorescent layer 405 as a red-emitting layer, the second fluorescent layer 406 as a green-emitting layer, and the third fluorescent layer 407 as a blue-emitting layer are sequentially stacked on the transparent resin layer 404.

As with the light-emitting device shown in FIG. 2, the light-emitting device shown in FIG. 3 is also a white light-emitting device. Since the blue-emitting layer is formed in the light-emitting device shown in FIG. 3, the device has characteristics that color rendering properties become higher than those of the light-emitting device shown in FIG. 2.

The red emitting luminescent material contained in the second fluorescent layer 406 and the blue emitting luminescent material contained in the third fluorescent layer 407 will be described hereinafter.

As the red emitting luminescent material, for example, a red emitting luminescent material (R) having the composition represented by the composition formula (2) below can be used.

$$(Sr_{1-s}Eu_s)_a Si_b AlO_c N_d \quad (2)$$

(wherein 0<s<1.0, 0.55<a<0.95, 2<b<3.9, 0<c<0.6, 4<d<5.7)

The red emitting luminescent material (R) basically contains an inorganic compound having a crystal structure substantially similar to that of $Sr_2Si_7Al_3ON_{13}$. The luminescent material exhibits high quantum efficiency because the composition of each element is specified within a predetermined range.

As shown in the composition formula (2) above, the red emitting luminescent material (R) contains the same element as that of the green emitting luminescent material having the composition represented by the composition formula (1). The red emitting luminescent material (R) can be synthesized using the same raw material powder as in the case of the green emitting luminescent material. A mixed powder obtained by mixing raw material powder, to obtain a predetermined composition, is burned and the red emitting luminescent material (R) is obtained. However, the conditions of the heat treatment for burning are different from those of the green emitting luminescent material.

The mixed powder is heat-treated in the nitrogen atmosphere to obtain a red emitting luminescent material. The heat treatment time is generally 4 hours or less and a shorter time is preferable. The heat treatment time is preferably 3 hours or less, more preferably 2 hours or less, most preferably 1 hour or less. If the heat treatment time is too long, crystal aggregation proceeds and the particle diameter becomes larger, resulting in a decrease in the quantum efficiency. When the heat treatment time is long, a ratio of a crystal having a predetermined aspect ratio tends to decrease.

If the heat treatment is performed for 0.1 hour or more, the reaction sufficiently proceeds and thus a target red emitting luminescent material is obtained. The heat treatment time is more preferably 0.5 hours or more, most preferably 1 hour or more.

Due to the same reason as in the case of the green emitting luminescent material according to this embodiment, it is desirable that the heat treatment is performed at a pressure more than an atmospheric pressure in the case of the red emitting luminescent material as well. The temperature range of the heat treatment can be the same as that of the above green emitting luminescent material.

The powder after burning is subjected to post-treatment such as washing, if necessary, and the red emitting luminescent material having the composition represented by the composition formula (2) is obtained. The washing can be performed using, for example, pure water or acid.

The blue emitting luminescent material is not particularly limited as long as it exhibits an emission having a peak at 400 to 490 nm and has predetermined temperature characteristics. In order to obtain a light-emitting device with a small color shift, it is desirable that temperature characteristics of the blue emitting luminescent material are as good as those of the red emitting luminescent material and the green emitting luminescent material.

Specific examples of a preferred blue emitting luminescent material include $(Ba, Eu)MgAl_{10}O_{17}$, $(Sr, Ca, Ba, Eu)_{10}(PO_4)_5Cl_2$, and $(Sr, Eu)Si_9Al_{19}ON_{31}$.

If the red emitting luminescent material is used together with the green emitting luminescent material of this embodiment, a balance between a red light component and a green light component which are emitted from the light-emitting device is even more hard to lose. Thus, the effect for suppressing the color shift is increased.

The green emitting luminescent material and the red emitting luminescent material have low thermal quenching. Thus, a light-emitting device having a small change in the green light component and the red light component even during driving at high power is obtained. At each temperature in a temperature range of room temperature to about 200° C., a behavior of the thermal quenching of the red emitting luminescent material is about equal to that of the thermal quenching of the green emitting luminescent material of this embodiment. Therefore, even when the device temperature is increased by driving at high power, the color shift between the green light component and the red light component can largely be reduced.

If the green emitting luminescent material and the red emitting luminescent material are contained, the green emitting luminescent material and the red emitting luminescent material which have a composition different from those of the above materials may be further contained.

When the blue emitting luminescent material is used, it is preferable that the thermal quenching of the blue emitting luminescent material is about equal to that of the red and green emitting luminescent materials. The combined use of the luminescent materials allows the color shift of the white light-emitting device to be further reduced. As described above, since the thermal quenching during driving in the green emitting luminescent material and the red emitting luminescent material is small, a balance between an emission from a light-emitting element and a blue component emitted from the blue emitting luminescent material is hardly lost. Therefore, the color shift can be further reduced. Since the emission wavelength from the blue emitting luminescent material can be supported by an LED which is a light-emitting element, it is not necessarily exactly like the red emitting luminescent material or the green emitting luminescent material.

The light-emitting element to be used for the light-emitting device is appropriately selected according to the luminescent material to be used. That is, it is necessary that light emitted from the light-emitting element can excite the luminescent material to be used. When the white light-emitting device is configured, it is preferable to use a light-emitting element capable of emitting light with a wavelength that supports the light emitted from the luminescent material.

From such a viewpoint, as described with reference to FIG. 2, in the case of the white light-emitting device using the red emitting luminescent material and the green emitting luminescent material as luminescent materials, a light-emitting element which emits light with a wavelength of 250 to 500 nm is selected. As described with reference to FIG. 3, in the case of the white light-emitting device using the red emitting luminescent material, the green emitting luminescent material, and the blue emitting luminescent material as luminescent materials, a light-emitting element which emits light with a wavelength of 250 to 430 nm is selected.

As described above, in the green emitting luminescent material according to this embodiment, a decrease in the emission intensity at high temperature is small. Since the luminescent material is used, a color shift in the light-emitting device of this embodiment is suppressed even during driving at a high power.

Hereinafter, specific examples of the luminescent material will be shown.

<Synthesis of Green Emitting Luminescent Materials (G1) to (G4)>

As a raw material powder, $Sr_3N_2$, EuN, $Si_3N_4$, $Al_2O_3$, and AlN were prepared and weighed in a vacuum glove box. The blending masses of $Sr_3N_2$, EuN, $Si_3N_4$, $Al_2O_3$, and AlN were 2.676 g, 0.398 g, 6.080 g, 0.680 g, and 0.683 g, respectively. The weighed raw material powder was placed in an agate mortar in the order of mixing mass from low to high, followed by dry blending. The obtained mixture was placed in a boron nitride (BN) crucible and it was heat treated in a nitrogen atmosphere at a pressure of 7.5 atmospheres at 1850° C. for 4 hours to obtain a powder.

The powder after the heat treatment in the nitrogen atmosphere was crushed and mixed. The resultant product was burned by heat-treating in a 10 Pa vacuum atmosphere at 500° C. for 30 minutes. Subsequently, the product was burned by heat-treating at a hydrogen concentration of 50% in a reducing atmosphere of $N_2/H_2$ at 1500° C. for 12 hours. Then, a luminescent material (G1) with a design composition of $(Sr_{0.92}Eu_{0.08})_3Al_3Si_{13}O_2N_{21}$ was obtained.

Green emitting luminescent materials (G2) to (G4) were obtained in the same manner as described in the case of the green emitting luminescent material (G1) except that the heat treatment temperature in the vacuum atmosphere was changed as follows:

Green emitting luminescent material (G2): 400° C.
Green emitting luminescent material (G3): 450° C.
Green emitting luminescent material (G4): 475° C.

All of the luminescent materials (G1) to (G4) after burning were particles of a yellow-green body color. A green emission was observed as a result of exciting by black light.

As for the green emitting luminescent materials (G1) to (G4) thus obtained, each main peak in an X-ray diffraction pattern was examined. The X-ray diffraction was performed using a powder X-ray diffractometer (M18XHF22, manufactured by BrukerAXS) under conditions (θ/2θ method, target: CuKα, 40 kV-100 mA, scan speed: 1°/min). The number corresponding to a main peak of the crystal of $Sr_3Al_3Si_{13}O_2N_{21}$ in an X-ray diffraction pattern of $20°\leq 2\theta\leq 70°$ as a standard among the obtained main peaks was calculated.

The main peak of the crystal of $Sr_3Al_3Si_{13}O_2N_{21}$ in an X-ray diffraction pattern of $20°\leq 2\theta\leq 70°$ was a peak of 18 as below. However, any peak includes a range of ±0.1°.
  20.5°, 21.6°, 23.8°, 25.8°, 29.4°, 31.0° 31.7°, 32.0°, 34.2°, 34.9°, 36.1°, 36.4° 37.5°, 38.4°, 39.9°, 61.5°, 62.3°, 63.0°

The oxygen concentration in each luminescent material was measured by an XPS method. The used measurement device was a Quantera SXM (manufactured by PHI) and measurement conditions were as follows:

X-ray source/output power/analytical region: single crystal AlKα/4.5 W/φ20 μm
Pass Energy: Narrow Scan-280.0 eV (0.25 eV/Step)
Geometry: θ=45° (θ: angle of the surface of a sample with respect to a detector)
Ar+ etching condition:
  Accelerating voltage 2 kV
  Raster size 2×2 mm
  Interval 0.25 min/step (about 1.7 nm/step)
  Rate of about 6.9 nm/min (in the case of T-SiO$_2$)

A ratio of the atomic number in a position toward the depth direction from the surface was obtained by measurement. Based on the measurement results, an average ($O_{outer}$) of oxygen concentrations in an outer region within a depth of 5 nm from the surface and an average ($O_{inner}$) of oxygen concentrations in an inner region with a depth deeper than 5 nm from the surface were obtained. Specifically, a ratio of an average of atomic ratios in each position within a depth of 5 nm from the surface to an average of atomic ratios in a position with a depth of 5 to 150 nm from the surface was calculated to obtain ($O_{outer}$) and ($O_{inner}$) averages and then an oxygen concentration ratio ($O_{outer}/O_{inner}$) was calculated.

The quantum efficiency of each luminescent material was measured using an absolute PL quantum efficiency measurement device (C9920-02G, manufactured by Hamamatsu Photonics K.K.). Specifically, the case where photons with which the luminescent material is irradiated are absorbed to the luminescent material, all the absorbed photons are converted to wavelengths, and they are released is defined as 100%. Then, the quantum efficiency was calculated. The quantum efficiency is required to be 65% or more.

Each luminescent material was excited by light with a wavelength of 457 nm and the wavelength of each emission peak was examined.

The obtained results are summarized in Table 1 below together with the heat treatment temperature in the vacuum atmosphere.

TABLE 1

| Matching peak number | Oxygen concentration ratio | Quantum efficiency (%) | Emission wavelength (nm) | Heat treatment temperature (° C.) |
|---|---|---|---|---|
| G1 | 15 | 2.7 | 78 | 524 | 500 |
| G2 | 14 | 1.0 | 74 | 524 | 400 |
| G3 | 15 | 1.3 | 78 | 526 | 450 |
| G4 | 15 | 2.4 | 75 | 525 | 475 |

As shown in Table 1 above, more than 14 peaks in the luminescent materials (G1) to (G4) correspond to a standard value and thus they are a $Sr_3Al_3Si_{13}O_2N_{21}$-based crystal. In the luminescent materials (G1) to (G4), the oxygen concentration ratio is within a range of 1.0 to 3.8 and a quantum efficiency of 74% or more is obtained.

All of the luminescent materials have an emission having a peak between the wavelengths of 490 nm and 580 nm and are green emitting luminescent materials.

Figure 4:
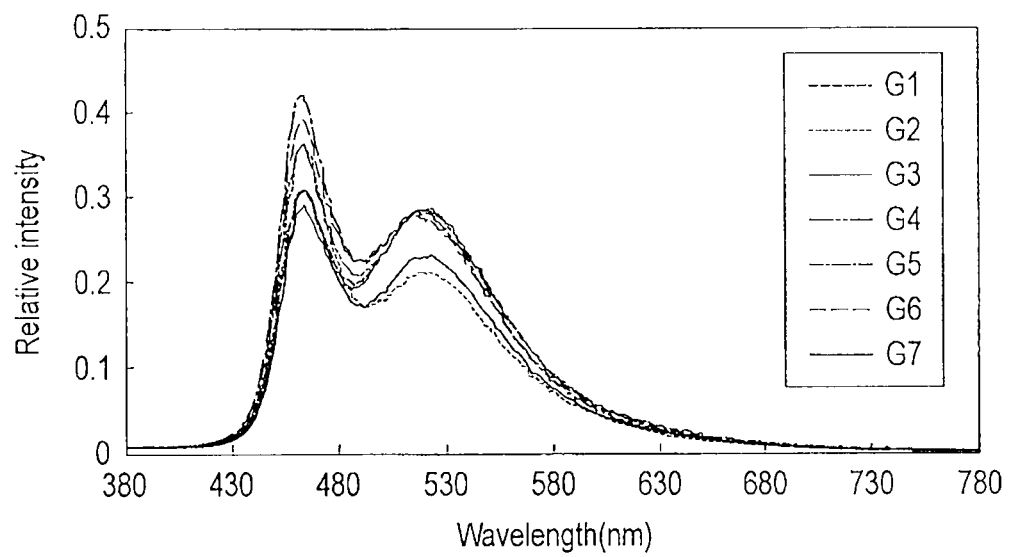
FIG. 4 is an emission spectrum of a luminescent material of Examples.

The emission spectra at 457 nm excitation of the green emitting luminescent materials (G1) to (G4) were as shown in FIG. 4. Relative intensities shown in FIG. 4 were calculated by setting a peak intensity of an excitation source to 1. As illustrated, as for the green emitting luminescent materials (G1) to (G4), the relative intensity at a wavelength of 490 to 580 nm was about 0.2 at minimum and as high as 0.3 at maximum. Usually, the relative intensity is required to be 0.1 or more. Thus, it was confirmed that the green emitting luminescent materials (G1) to (G4) emitted light with sufficient intensity.

<Synthesis of Red Emitting Luminescent Material (R1)>

As starting materials, $Sr_3N_2$, EuN, $Si_3N_4$, $Al_2O_3$, and AlN were prepared and weighed in a vacuum glove box. The blending masses of $Sr_3N_2$, EuN, $Si_3N_4$, $Al_2O_3$, and AlN are 2.579 g, 0.232 g, 4.583 g, 0.476 g, and 1.339 g, respectively. The weighed raw material powder was placed in an agate mortar, followed by dry blending. The obtained mixture was placed in a BN crucible and burned in a nitrogen atmosphere at a pressure of 7.5 atmospheres at 1850° C. for 4 hours to obtain a luminescent material (R1) with a design composition of $(Sr_{0.95}Eu_{0.05})_2Al_3Si_7ON_{13}$.

The luminescent material (R1) after burning is a particle of an orange body color. When the luminescent material (R1) was excited by black light, a red emission was observed. When the material was excited by light with a wavelength of 457 nm, an emission peak wavelength of the luminescent material (R1) was 598 nm.

Figure 5:
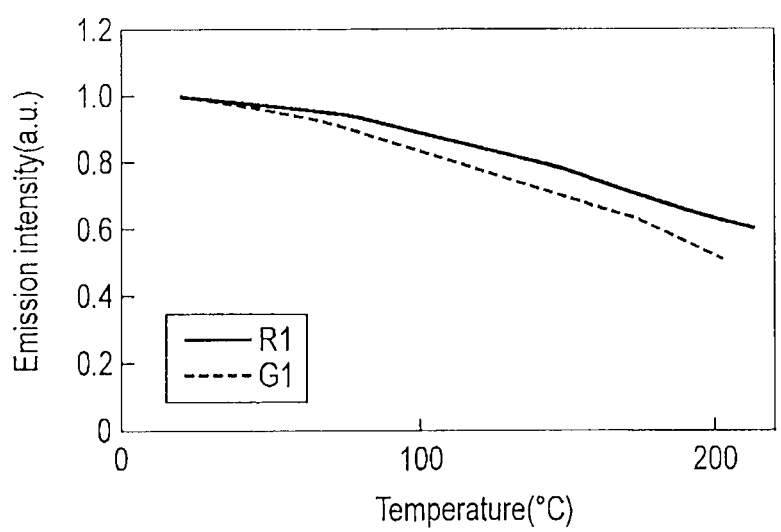
FIG. 5 is a graph diagram showing temperature characteristics of the luminescent material of Examples.

Here, the temperature dependency of the emission intensity of the green emitting luminescent material (G1) and the red emitting luminescent material (R1) is shown in FIG. 5. The illustrated results are obtained by standardizing the emission intensity at room temperature as 1. As shown in FIG. 5, the emission intensity at 200° C. of the green emitting luminescent material (G1) is around 0.6 in the case of room temperature. If about 50% of the emission intensity in the case of room temperature can be ensured at 200° C., this is acceptable. Accordingly, it is found that a decrease in the emission intensity due to an increase in temperature in the green emitting luminescent material (G1) is small. As shown in FIG. 5, temperature characteristics of the red emitting luminescent material (R1) are the same as those of the green emitting luminescent material (G1).

Since each concentration of Eu, i.e., a luminescence center, is in the same range, the green emitting luminescent materials (G2), (G3), and (G4) have a small decrease in emission intensity due to an increase in temperature, similarly to the green emitting luminescent material (G1).

EXAMPLE 1

A light-emitting device of the configuration shown in FIG. 2 was produced using the green emitting luminescent material (G1) and the red emitting luminescent material (R1). A light emitting diode having an emission peak wavelength of 455 nm as the light-emitting element 402 was soldered onto the AlN package 401 of 8 mm². One of the electrodes of the light-emitting element 402 was connected to the electrode of the AlN package 401 via the gold wire 403.

Silicone was applied on the light-emitting element 402 to form the transparent resin layer 404 with a dome shape. The first fluorescent layer 405 and the second fluorescent layer 406 were sequentially formed on the transparent resin layer 404. In the formation of the first fluorescent layer 405, transparent resin (silicone) containing 30% by mass of a red emitting luminescent material (R1) was used. In the formation of the second fluorescent layer 406, transparent resin (silicone) containing 30% by mass of the green emitting luminescent material (G1) was used.

When the light-emitting device was installed in an integrating sphere and driven at 20 mA and 3.1 V, the chromaticity was (0.345, 0.352), the color temperature was 5000 K, the luminous flux efficiency was 67.9 lm/W, and Ra was equal to 86.

Figure 6:
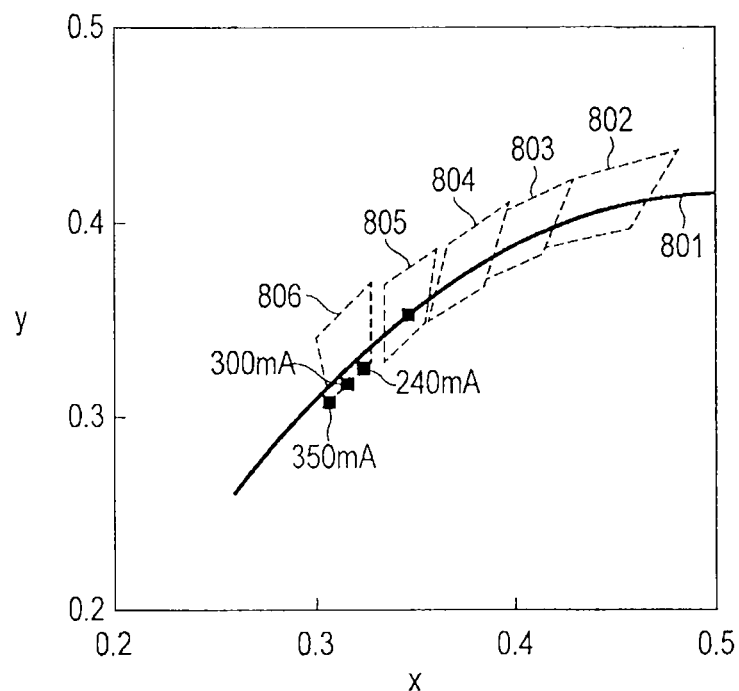
FIG. 6 is a graph diagram showing the chromaticity (2 degree field of view) of the light-emitting device of Examples.

Emission characteristics were measured by the same procedure as described above while increasing the driving current of the light-emitting device to 350 mA. The results are shown in FIG. 6. In FIG. 6, 801 represents the color trajectory of the black body radiation, and 802 to 806 represent chromaticity ranges of a predetermined color in accordance with JIS. Specific examples are as follows:
    802: chromaticity range of daylight color;
    803: chromaticity range of daytime white color;
    804: chromaticity range of white color;
    805: chromaticity range of warm white color; and
    806: chromaticity range of electric bulb color As illustrated, the light-emitting device of this example using the green emitting luminescent material (G1) together with the red emitting luminescent material (R1) had small changes in chromaticity even if the driving current was increased and did not deviate from the chromaticity range in accordance with JIS even during driving at 350 mA. The luminous flux efficiency and Ra had small changes even if the driving current was increased as follows:
    240 mA drive: 52.0 lm/W, Ra=79
    300 mA drive: 48.3 lm/W, Ra=77
    350 mA drive: 43.9 lm/W, Ra=75

EXAMPLE 2

A light-emitting device of this example was produced in the same manner as described in Example 1 except that the green emitting luminescent material was changed to the green emitting luminescent material (G2). When the light-emitting device was installed in an integrating sphere and driven at 20 mA and 3.1 V, the chromaticity was (0.345, 0.352), the color temperature was 5000 K, the luminous flux efficiency was 73.8 lm/W, and Ra was equal to 79.

Figure 7:
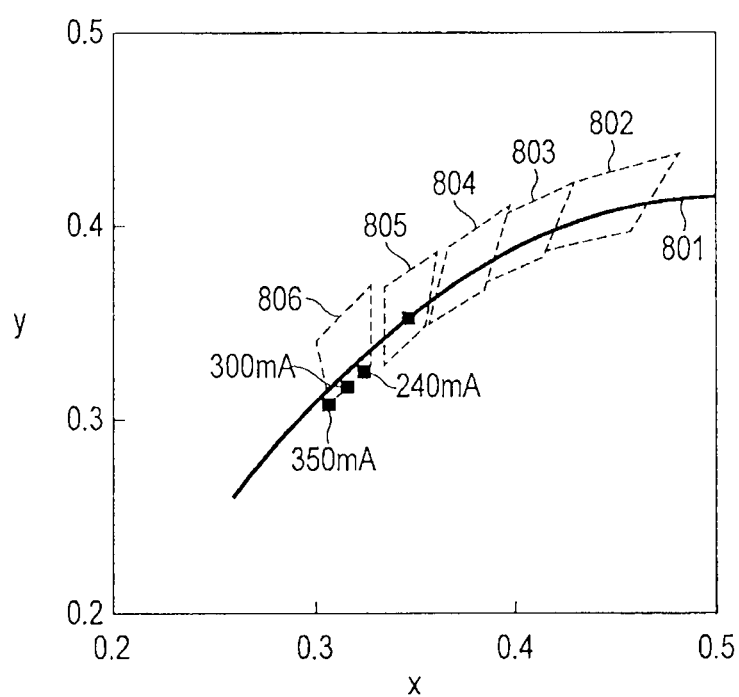
FIG. 7 is a graph diagram showing the chromaticity (2 degree field of view) of the light-emitting device of Examples.

Emission characteristics were measured by the same procedure as described above while increasing the driving current of the light-emitting device to 350 mA. The results are shown in FIG. 7. As illustrated, the light-emitting device of this example using the green emitting luminescent material (G2) together with the red emitting luminescent material (R1) had small changes in chromaticity even if the driving current was increased and did not deviate from the chromaticity range in accordance with JIS even during driving at 350 mA. The luminous flux efficiency and Ra had small changes as follows:
    240 mA drive: 56.8 lm/W, Ra=78
    300 mA drive: 53.5 lm/W, Ra=77
    350 mA drive: 49.1 lm/W, Ra=76

EXAMPLE 3

A light-emitting device of this example was produced in the same manner as described in Example 1 except that the green emitting luminescent material was changed to the green emitting luminescent material (G3). When the light-emitting device was installed in an integrating sphere and driven at 20 mA and 3.1 V, the chromaticity was (0.345, 0.352), the color temperature was 5000 K, the luminous flux efficiency was 64.8 lm/W, and Ra was equal to 90.

Figure 8:
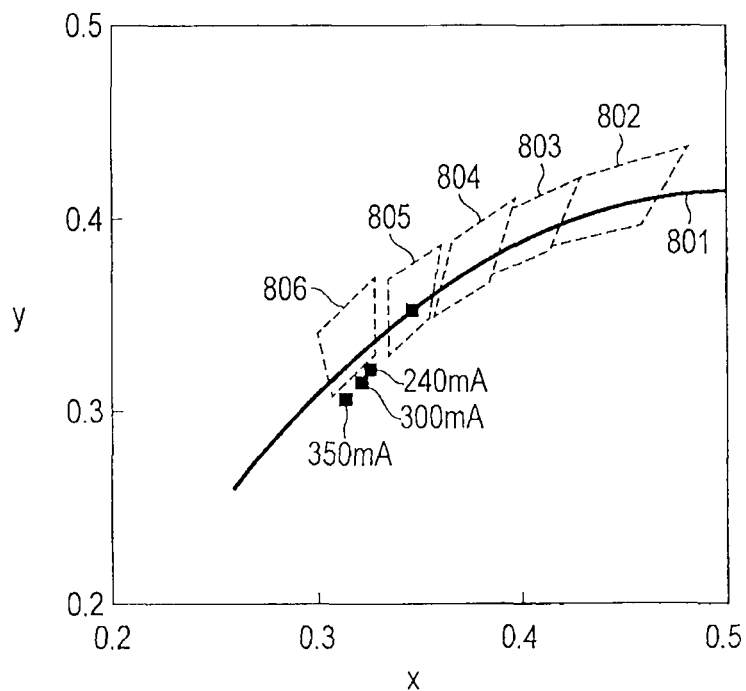
FIG. 8 is a graph diagram showing the chromaticity (2 degree field of view) of the light-emitting device of Examples.

Emission characteristics were measured by the same procedure as described above while increasing the driving current of the light-emitting device to 350 mA. The results are shown in FIG. 8. As illustrated, the light-emitting device of this example using the green emitting luminescent material (G3) together with the red emitting luminescent material (R1) had small changes in chromaticity even if the driving current was increased and did not deviate from the chromaticity range in accordance with JIS even during driving at 350 mA. The luminous flux efficiency and Ra had small changes as follows:
    240 mA drive: 51.0 lm/W, Ra ~85
    300 mA drive: 48.0 lm/W, Ra=84
    350 mA drive: 44.3 lm/W, Ra=82

<Synthesis of Green Emitting Luminescent Materials (G5) to (G7)>

Green emitting luminescent materials (G5) to (G7) were obtained in the same manner as described in the green emitting luminescent material (G1) except that the heat treatment temperature in a vacuum atmosphere was changed as follows.

Green emitting luminescent material (G5): 525° C.
Green emitting luminescent material (G6): 550° C.
Green emitting luminescent material (G7): 600° C.

The luminescent materials (G5) to (G7) after burning are particles of yellow-green body color. As a result of exciting with black light, green emission was observed.

As for the green emitting luminescent materials (G5) to (G7) thus obtained, the matching peak number, oxygen concentration ratio, quantum efficiency, and emission wavelength were examined. The results are summarized in Table 2, together with the heat treatment temperature in the vacuum atmosphere.

TABLE 2

| | Matching peak number | Oxygen concentration ratio | Quantum efficiency (%) | Emission wavelength (nm) | Heat treatment temperature (° C.) |
|---|---|---|---|---|---|
| G5 | 15 | 3.2 | 75 | 526 | 525 |
| G6 | 15 | 3.8 | 65 | 528 | 550 |
| G7 | 13 | 1.2 | 80 | 527 | 600 |

As shown in Table 2 above, the luminescent materials (G5) to (G7) are a $Sr_3Al_3Si_{13}O_2N_{21}$-based crystal because a peak of 13 or more corresponds to the standard. In the luminescent materials (G5) to (G7), the oxygen concentration ratio is within a range of 1.1 to 3.8 and a quantum efficiency of 63% or more is obtained.

All of the luminescent materials have an emission having a peak between the wavelengths of 490 nm and 580 nm and are green emitting luminescent materials.

The emission spectra at 457 nm excitation of the green emitting luminescent materials (G5) to (G7) were as shown in FIG. 4. Relative intensities shown in FIG. 4 were calculated by setting a peak intensity of an excitation source to 1. As illustrated, as for the green emitting luminescent materials (G5) to (G7), the relative intensity at a wavelength of 490 to 580 nm was about 0.2 at minimum and as high as 0.30 at maximum. It was confirmed that the green emitting luminescent materials (G5) to (G7) emitted light with sufficient intensity.

Since each concentration of Eu, i.e., a luminescence center, is in the same range, the green emitting luminescent materials (G5), (G6), and (G7) have a small decrease in emission intensity due to an increase in temperature, similarly to the green emitting luminescent material (G1).

EXAMPLE 4

A light-emitting device of this example was produced in the same manner as described in Example 1 except that the green emitting luminescent material was changed to the green emitting luminescent material (G5). When the light-emitting device was installed in an integrating sphere and driven at 20 mA and 3.1 V, the chromaticity was (0.345, 0.352), the color temperature was 5000 K, the luminous flux efficiency was 69.73 lm/W, and Ra was equal to 88.

Emission characteristics were measured by the same procedure as described above while increasing the driving current of the light-emitting device to 350 mA. As a result, even if the driving current was increased, changes of chromaticity were small. Similarly, the luminous flux efficiency and Ra had small changes.

EXAMPLE 5

A light-emitting device of this example was produced in the same manner as described in Example 1 except that the green emitting luminescent material was changed to the green emitting luminescent material (G6). When the light-emitting device was installed in an integrating sphere and driven at 20 mA and 3.1 V, the chromaticity was (0.345, 0.352), the color temperature was 5000 K, the luminous flux efficiency was 62.9 lm/W, and Ra was equal to 79.

Emission characteristics were measured by the same procedure as described above while increasing the driving current of the light-emitting device to 350 mA. As a result, even if the driving current was increased, changes of chromaticity were small. Similarly, the luminous flux efficiency and Ra had small changes.

EXAMPLE 6

A light-emitting device of this example was produced in the same manner as described in Example 1 except that the green emitting luminescent material was changed to the green emitting luminescent material (G7). When the light-emitting device was installed in an integrating sphere and driven at 20 mA and 3.1 V, the chromaticity was (0.345, 0.352), the color temperature was 5000 K, the luminous flux efficiency was 74.8 lm/W, and Ra was equal to 90.

Emission characteristics were measured by the same procedure as described above while increasing the driving current of the light-emitting device to 350 mA. As a result, even if the driving current was increased, changes of chromaticity were small. Similarly, the luminous flux efficiency and Ra had small changes.

EXAMPLE 7

A light-emitting device of the configuration shown in FIG. 3 was produced using the green emitting luminescent material (G4) together with the red emitting luminescent material and the blue emitting luminescent material. As the red emitting luminescent material, the red emitting luminescent material (R1) was used. As the blue emitting luminescent material (B1), $(Ba_{0.9}Eu_{0.1})MgAl_{10}O_{17}$ was used.

A light emitting diode having an emission peak wavelength of 390 nm as the light-emitting element 402 was soldered onto the AlN package 401 of 8 mm². One of the electrodes of the light-emitting element 402 was connected to the electrode of the AlN package 401 via the gold wire 403.

Silicone was applied on the light-emitting element 402 to form the transparent resin layer 404 with a dome shape. The first fluorescent layer 405, the second fluorescent layer 406, and the third fluorescent layer 407 were sequentially formed on the transparent resin layer 404. In the formation of the first fluorescent layer 405, transparent resin (silicone) containing 30% by mass of the red emitting luminescent material (R1) was used. In the formation of the second fluorescent layer 406, transparent resin (silicone) containing 30% by mass of the green emitting luminescent material (G4) was used. In the formation of the third fluorescent layer 407, transparent resin (silicone) containing 30% by mass of the blue emitting luminescent material (B1) was used.

Figure 9:
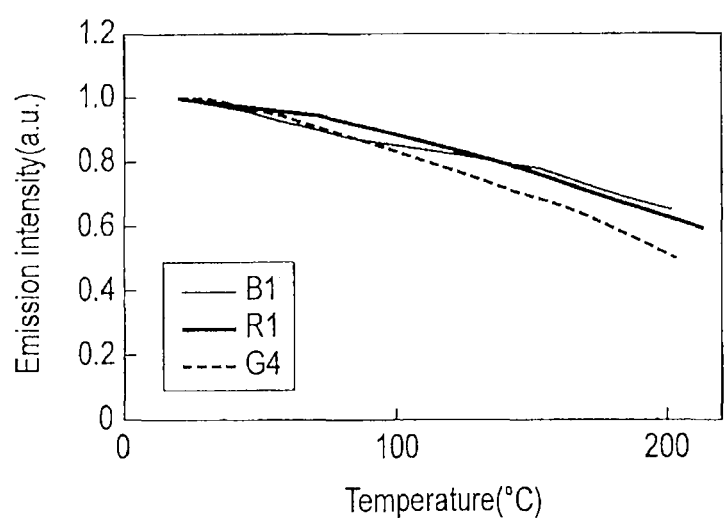
FIG. 9 is a graph showing temperature characteristics of the luminescent material of Examples.

The temperature dependency of the emission intensity of the green emitting luminescent material (G4), the red emitting luminescent material (R1), and the blue emitting luminescent material (B1) used herein was as shown in FIG. 9. The illustrated results are obtained by standardizing the emission intensity at room temperature as 1. As shown in FIG. 9, the emission intensity at 200° C. of the green emitting luminescent material (G4) is around 0.6 in the case of room temperature. If about 50% of the emission intensity in the case of room temperature can be ensured at 200° C., this is acceptable. Accordingly, it is found that a decrease in the emission intensity due to an increase in temperature in the green emitting luminescent material (G4) is small. As shown in FIG. 9, temperature characteristics of the red emitting luminescent material (R1) and the blue emitting luminescent material (B1) are the same as those of the green emitting luminescent material (G4).

When the light-emitting device of this example was installed in an integrating sphere and driven at 20 mA and 3.1 V, the chromaticity was (0.345, 0.352), the color temperature was 5000 K, the luminous flux efficiency was 62.39 lm/W, and Ra was equal to 90.

Emission characteristics were measured by the same procedure as described above while increasing the driving current of the light-emitting device to 350 mA. The results are shown in FIG. 10. As illustrated, the light-emitting device of this example using the green emitting luminescent material (G4) together with the red emitting luminescent material (R1) and the blue emitting luminescent material (B1) had small changes in chromaticity even if the driving current was increased and did not deviate from the chromaticity range of daytime white color in accordance with JIS even during driving at 350 mA.

The luminous flux efficiency, Ra, and chromaticity had small changes as shown below.
240 mA drive: 47.7 lm/W, Ra=89
(x, y)=(0.341, 0.348)
300 mA drive: 44.7 lm/W, Ra=88
(x, y) (0.339, 0.349)
350 mA drive: 41.5 lm/W, Ra=88
(x, y)=(0.336, 0.347)

The emission spectrum of the light-emitting device of Example 1 is shown in FIG. 11. The obtained emission spectra of the light-emitting devices of Examples 2 to 7 were almost the same as those of FIG. 11.

EXAMPLE 8

As starting materials, $SrCO_3$, $Eu_2O_3$, $Si_3N_4$, and AlN were prepared and weighed to 0.664 g, 0.792 g, 3.788 g, and 7.009 g, respectively, and they were placed in an agate mortar, followed by dry blending. The obtained mixture was placed in a BN crucible and burned in a nitrogen atmosphere at a pressure of 7.5 atmospheres at 1800° C. for 4 hours to obtain a blue emitting luminescent material (B2) with a design composition of $(Sr_{0.50}Eu_{0.50})_3Al_{19}Si_9ON_{31}$.

The red emitting luminescent material (R1) and the green emitting luminescent material (G1) similar to those described above were prepared, and then the temperature dependency of emission intensity was examined together with the blue emitting luminescent material. The results obtained by standardizing the emission intensity at room temperature as 1 are shown in FIG. 12. As shown in FIG. 12, the emission intensity at 200° C. of the green emitting luminescent material (G1) is around 0.6 in the case of room temperature. If about 50% of the emission intensity in the case of room temperature can be ensured at 200° C., this is acceptable. Accordingly, it is found that a decrease in the emission intensity due to an increase in temperature in the green emitting luminescent material (G1) is small. As shown in FIG. 12, temperature characteristics of the red emitting luminescent material (R1) and the blue emitting luminescent material (B2) are the same as those of the green emitting luminescent material (G1).

A light-emitting device of this example was produced in the same manner as described in Example 7 except that the three types of the luminescent materials were used. When the light-emitting device was installed in an integrating sphere and driven at 20 mA and 3.1 V, the chromaticity was (0.345, 0.352), the color temperature was 5000 K, the luminous flux efficiency was 56.09 lm/W, and Ra was equal to 89. The emission spectrum of the light-emitting device was as shown in FIG. 13.

Emission characteristics were measured by the same procedure as described above while increasing the driving current of the light-emitting device to 350 mA. The results are shown in FIG. 14. As illustrated, the light-emitting device of this example using the green emitting luminescent material (G1) together with the red emitting luminescent material (R1) and the blue emitting luminescent material (B2) had small changes in chromaticity even if the driving current was increased and did not deviate from the chromaticity range of daytime white color in accordance with JIS even during driving at 350 mA.

The luminous flux efficiency and Ra had small changes as follows:
240 mA drive: 43.9 lm/W, Ra=85
(x, y)=(0.331, 0.340)
300 mA drive: 43.9 lm/W, Ra=85
(x, y)=(0.329, 0.339)
350 mA drive: 38.0 lm/W, Ra=84
(x, y)=(0.327, 0.337)

<Synthesis of Green Emitting Luminescent Materials (G8) to (G10)>

As a raw material powder, $Sr_3N_2$, EuN, $Si_3N_4$, $Al_2O_3$, and AlN were prepared and weighed in a vacuum glove box. A green emitting luminescent material (G8) was obtained in the same manner as the green emitting luminescent material (G1) except that the blending masses of $Sr_3N_2$, EuN, $Si_3N_4$, $Al_2O_3$, and AlN were 2.676 g, 0.398 g, 6.548 g, 0.340 g, and 0.547 g, respectively.

A green emitting luminescent material (G9) was obtained in the same manner as the green emitting luminescent material (G1) except that the blending masses of $Sr_3N_2$, EuN, $Si_3N_4$, $Al_2O_3$, and AlN were 2.676 g, 0.398 g, 6.431 g, 0.425 g, and 0.581 g, respectively.

A green emitting luminescent material (G10) was obtained in the same manner as the green emitting luminescent material (G1) except that the blending masses of $Sr_3N_2$, EuN, $Si_3N_4$, $Al_2O_3$, and AlN were 2.676 g, 0.398 g, 6.314 g, 0.510 g, and 0.615 g, respectively.

All of the luminescent materials (G8) to (G10) after burning are particles of yellow-green body color. As a result of exciting with black light, green emission was observed.

As for the green emitting luminescent materials (G8) to (G10) thus obtained, the matching peak number, oxygen concentration ratio, quantum efficiency, and emission wavelength were examined. The results are summarized in Table 3, together with the heat treatment temperature in the vacuum atmosphere.

TABLE 3

| | Matching peak number | Oxygen concentration ratio | Quantum efficiency (%) | Emission wavelength (nm) | Heat treatment temperature (° C.) |
|---|---|---|---|---|---|
| G8 | 14 | 2.3 | 88 | 529 | 500 |
| G9 | 15 | 1.9 | 91 | 528 | 500 |
| G10 | 14 | 1.4 | 91 | 529 | 500 |

As shown in Table 3 above, more than 14 peaks in the luminescent materials (G8) to (G10) correspond to a standard value, thus they are the $Sr_3Al_3Si_{13}O_2N_{21}$-based crystal. In the luminescent materials (G8) to (G10), the oxygen concentration ratio is within a range of 1.0 to 3.8 and a quantum efficiency of 88% or more is obtained.

All of the luminescent materials have an emission having a peak between the wavelengths of 490 nm and 580 nm and are green emitting luminescent materials.

Since each concentration of Eu, i.e., a luminescence center, is in the same range, the green emitting luminescent materials (G8), (G9), and (G10) have a small decrease in emission intensity due to an increase in temperature, similarly to the green emitting luminescent material (G1). It is assumed that the same emission characteristics are obtained in the light-emitting device produced in combination with the red emitting luminescent material (R1).

<Synthesis of Green Emitting Luminescent Materials (G11) to (G13)>

Green emitting luminescent materials (G11) to (G13) were obtained in the same manner as described in the green emitting luminescent material (G1) except that the heat treatment conditions in a vacuum atmosphere were changed as follows:

Green emitting luminescent material (G11): without heat treatment in a vacuum atmosphere;
Green emitting luminescent material (G12): 350° C.
Green emitting luminescent material (G13): 650° C.

The luminescent materials (G11) to (G13) after burning are particles of yellow-green body color. As a result of exciting with black light, green emission was observed.

As for the green emitting luminescent materials (G11) to (G13) thus obtained, the matching peak number, oxygen concentration ratio, quantum efficiency, and emission wavelength were examined. The results are summarized in Table 4, together with the heat treatment temperature in the vacuum atmosphere.

TABLE 4

|  | Matching peak number | Oxygen concentration ratio | Quantum efficiency (%) | Emission wave-length (nm) | Heat treatment temperature (° C.) |
|---|---|---|---|---|---|
| G11 | 15 | 4.5 | 63 | 524 | — |
| G12 | 15 | 4.6 | 62 | 514 | 350 |
| G13 | 13 | 0.9 | 61 | 518 | 650 |

As shown in Table 4 above, more than 13 peaks in the luminescent materials (G11) to (G13) correspond to a standard value. However, the oxygen concentration ratio is not within the range of 1.0 to 3.8. It is assumed that this causes the result that the quantum efficiency is 63% at most.

Emission spectra obtained by excitation at 457 nm in the green emitting luminescent materials (G11) to (G13) were as shown in FIG. 15. Emission intensities shown in FIG. 15 were calculated by setting a peak intensity of an excitation source to 1. As illustrated, the emission intensity at a wavelength of 490 to 580 nm as to the green emitting luminescent materials (G11) to (G13) was 0.08 at most. When compared with the results of the green emitting luminescent materials (G1) to (G4) shown in FIG. 4, it is found that sufficient emission intensity is not obtained in the green emitting luminescent materials (G11) to (G13). It is assumed that this is because after the heat treatment in the nitrogen atmosphere, the heat treatment in the vacuum atmosphere was not performed before the heat treatment in the reducing atmosphere.

As for the green emitting luminescent materials (G1) to (G13), a relationship between the oxygen concentration ratio ($O_{outer}/O_{inner}$) and the quantum efficiency is summarized in FIG. 16. As shown in FIG. 16, when the oxygen concentration ratio is too low, the quantum efficiency cannot be increased. When the oxygen concentration ratio is too large, the quantum efficiency cannot be increased. In order to increase the quantum efficiency, it is found that there is an appropriate range of the oxygen concentration ratio.

COMPARATIVE EXAMPLE 1

A light-emitting device of this comparative example was produced in the same manner as described in Example 1 except that the green emitting luminescent material was changed to the green emitting luminescent material (G11).

The temperature dependency of the emission intensity of the green emitting luminescent material (G11) and the red emitting luminescent material (R1) obtained by standardizing the emission intensity at room-temperature as 1 was as shown in FIG. 17. As shown in FIG. 17, the emission intensity at 200° C. of the green emitting luminescent material (G11) is less than 0.3 in the case of room temperature. Accordingly, it is found that a decrease in the emission intensity due to an increase in temperature is large.

When the light-emitting device was installed in an integrating sphere and driven at 20 mA and 3.1 V, the chromaticity was (0.345, 0.352), the color temperature was 5000 K, the luminous flux efficiency was 24.0 lm/W, and Ra was equal to 91.

Emission characteristics were measured by the same procedure as described above while increasing the driving current of the light-emitting device to 350 mA. The results are shown in FIG. 18. As illustrated, as for the light-emitting device of this example using the green emitting luminescent material (G11) together with the red emitting luminescent material (R1), the chromaticity was significantly changed by an increase in the driving current and largely deviated from the chromaticity range of JIS. The luminous flux efficiency and Ra were significantly reduced as follows:

240 mA drive: 15.5 lm/W, Ra=72
300 mA drive: 14.0 lm/W, Ra=66
350 mA drive: 12.2 lm/W, Ra=53

COMPARATIVE EXAMPLE 2

A light-emitting device of the configuration shown in FIG. 2 was produced using $(Ba_{0.1}Sr_{0.8})_2SiO_4:Eu^{2+}$ as the green emitting luminescent material (G14) and $(Sr_{0.8}Ca_{0.2})SiO_4:Eu^{2+}$ having a peak wavelength of 585 nm as the red emitting luminescent material (R2). A light emitting diode having an emission peak wavelength of 455 nm as the light-emitting element 402 was soldered onto the AlN package 401 of 8 mm². One of the electrodes of the light-emitting element 402 was connected to the electrode of the AlN package 401 via the gold wire 403.

Silicone was applied on the light-emitting element 402 to form the transparent resin layer 404 with a dome shape. The first fluorescent layer 405 and the second fluorescent layer 406 were sequentially formed on the transparent resin layer 404. In the formation of the first fluorescent layer 405, transparent resin (silicone) containing 40% by mass of a red emitting luminescent material (R2) was used. In the formation of the second fluorescent layer 406, transparent resin (silicone) containing 30% by mass of the green emitting luminescent material (G11) was used.

The temperature dependency of the emission intensity of the green emitting luminescent material (G14) and the red emitting luminescent material (R2) was as shown in FIG. 19. The illustrated results are obtained by standardizing the emission intensity at room temperature as 1. As shown in FIG. 19, the emission intensity at 200° C. of the green emitting luminescent material (G14) is less than 0.3 in the case of room temperature. Accordingly, it is found that a decrease in the emission intensity due to an increase in temperature is large.

When the light-emitting device of this example was installed in an integrating sphere and driven at 20 mA and 3.1 V, the chromaticity was (0.345, 0.352), the color temperature was 5000 K, the luminous flux efficiency was 68.6 lm/W, and Ra was equal to 86. The emission spectrum of the light-emitting device was as shown in FIG. 20.

Emission characteristics were measured by the same procedure as described above while increasing the driving current of the light-emitting device to 350 mA. The results are shown in FIG. 21. As illustrated, as for the light-emitting device of this comparative example using the green emitting luminescent material (G14) together with the red emitting luminescent material (R2), the chromaticity was significantly changed by an increase in the driving current and largely deviated from the chromaticity range of JIS. The luminous flux efficiency and Ra were significantly reduced as follows:

240 mA drive: 43.9 lm/W, Ra=76
300 mA drive: 33.9 lm/W, Ra=68
350 mA drive: 26.9 lm/W, Ra=57

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A luminescent material which emits light having an emission peak within a wavelength range of 490 to 580 nm when excited with light having a wavelength range of 250 to 500 nm, the luminescent material comprising:
   a particle comprising a $Sr_3Si_{13}Al_3O_2N_{21}$-based crystal activated by Eu and comprising an outer region which is within a depth of 5 nm from a surface of the particle and an inner region which is deeper than the outer region, the outer region having an average oxygen concentration $O_{outer}$ greater than an average oxygen concentration $O_{inner}$ of the inner region and satisfying a ration $O_{outer}/O_{inner}$ of 1.0 to 3.8.

2. The luminescent material according to claim 1, wherein main peaks of an X-ray diffraction profile of the luminescent material appears at more than 10 selected from 20.5±0.1°, 21.6±0.1°, 23.8±0.1°, 25.8±0.1°, 29.4±0.1°, 31.0±0.1°, 31.7±0.1°, 32.0±0.1°, 34.2±0.1°, 34.9±0.1°, 36.1±0.1°, 36.4±0.1°, 37.5±0.1°, 38.4±0.1°, 39.9±0.1°, 61.5±0.1°, 62.3±0.1°, and 63.0±0.1°.

3. The luminescent material according to claim 1, wherein the ratio $O_{outer}/O_{inner}$ is from 1.0 to 3.2.

4. The luminescent material according to claim 1, wherein the luminescent material has a composition represented by the following composition formula 1:

composition formula 1 wherein x, y, z and u are confined within the ranges shown below:
0<x<1, −0.1≤y≤0.30, −3≤z≤1, −3<u−w≤1.5.

5. The luminescent material according to claim 4, wherein x in the composition formula 1 is 0.001 or more.

6. The luminescent material according to claim 4, wherein x in the composition formula 1 is less than 0.05.

7. The luminescent material according to claim 4, wherein a part of the Si is substituted by at least one selected from the group consisting of Ge, Sn, Ti, Zr, and Hf.

8. The luminescent material according to claim 4, wherein a part of the Al is substituted by at least one selected from the group consisting of B, Ga, In, Sc, Y, La, Gd, and Lu.

9. The luminescent material according to claim 4, wherein a part of the N is substituted by at least one selected from the group consisting of O and C.

10. The luminescent material according to claim 4, further comprising at least one selected from the group consisting of Na, Ba, Ca, Mg, Cu, Fe, Pb, Cl, C and B.

11. The luminescent material according to claim 1, wherein a crystal structure of the luminescent material is a rhombic system.

12. A light-emitting device comprising:
   a light-emitting element which emits light having a wavelength range of 250 to 500 nm; and
   a green-emitting layer comprising a luminescent material which receives light from the light-emitting element and emits green light, the luminescent material which emits green light comprising the luminescent material according to claim 1.

13. The light-emitting device according to claim 12, further comprising a red-emitting layer comprising a red emitting luminescent material having an emission peak within a wavelength range of 580 to 660 nm.

14. The light-emitting device according to claim 13, wherein the red emitting luminescent material has the composition represented by the following composition formula 2:

composition formula 2 wherein "s", "a", "b", "c" and "d" are confined within the ranges shown below:
0<s<1.0, 0.55<a<0.95, 2<b<3.9, 0<c<0.6, 4<d<5.7.

15. The light-emitting device according to claim 12, wherein the light-emitting element emits light having a wavelength range of 250 to 430 nm and further comprises a red-emitting layer comprising a red emitting luminescent material having an emission peak within a wavelength range of 580 to 660 nm; and a blue-emitting layer comprising a blue emitting luminescent material having an emission peak within a wavelength range of 400 to 490 nm.

16. The light-emitting device according to claim 15, wherein the red emitting luminescent material has the composition represented by the following composition formula 2:

composition formula 2 wherein "s", "a", "b", "c" and "d" are confined within the ranges shown below:
0<s<1.0, 0.55<a<0.95, 2<b<3.9, 0<c<0.6, 4<d<5.7.

17. The light-emitting device according to claim 15, wherein the blue emitting luminescent material is selected from the group consisting of $(Ba, Eu)MgAl_{10}O_{17}$, $(Sr, Ca, Ba, Eu)_{10}(PO_4)_5Cl_2$, and $(Sr, Eu)Si_9Al_{19}ON_{31}$.

18. A method for manufacturing a luminescent material of claim 1, comprising:
   heating a mixed powder comprising Sr raw material, Al raw material, Si raw material, and Eu raw material in a nitrogen atmosphere to perform a first heat treatment, thereby obtaining a first heat-treated mixture;
   heating the first heat-treated mixture at 400 to 600° C. in a vacuum atmosphere to perform a second heat treatment, thereby obtaining a second heat-treated mixture; and heating the second heat-treated mixture in a reducing atmosphere of $N_2/H_2$ in which a hydrogen concentration is 1% or more and less than 100% to perform a third heat treatment.

19. The method according to claim 18, wherein the vacuum atmosphere in the second heat treatment is 13.3 Pa or less.

20. The method according to claim 18, wherein the second heat treatment is performed at a temperature of from 450 to 550° C.

* * * * *